(12) United States Patent
Huang

(10) Patent No.: US 10,854,637 B2
(45) Date of Patent: Dec. 1, 2020

(54) ARRAY SUBSTRATE AND DISPLAY PANEL

(71) Applicant: HKC CORPORATION LIMITED, Guangdong (CN)

(72) Inventor: Beizhou Huang, Guangdong (CN)

(73) Assignee: HKC CORPORATION LIMITED, Shenzhen (CN)

(*) Notice: Subject to any disclaimer, the term of this patent is extended or adjusted under 35 U.S.C. 154(b) by 0 days.

(21) Appl. No.: 16/312,746

(22) PCT Filed: Nov. 1, 2018

(86) PCT No.: PCT/CN2018/113345
§ 371 (c)(1),
(2) Date: Dec. 21, 2018

(87) PCT Pub. No.: WO2020/062422
PCT Pub. Date: Apr. 2, 2020

(65) Prior Publication Data
US 2020/0105798 A1   Apr. 2, 2020

(30) Foreign Application Priority Data
Sep. 27, 2018 (CN) .......................... 2018 1 1 31525

(51) Int. Cl.
*H01L 27/12* (2006.01)
*H01L 27/32* (2006.01)

(52) U.S. Cl.
CPC ...... *H01L 27/1225* (2013.01); *H01L 27/1248* (2013.01); *H01L 27/3258* (2013.01)

(58) Field of Classification Search
CPC ............. H01L 27/1225; H01L 27/1248; H01L 27/3258
See application file for complete search history.

(56) References Cited

U.S. PATENT DOCUMENTS 8,735,883 B2 *  5/2014  Kim .................... H01L 29/7869
257/43

* cited by examiner

*Primary Examiner* — Timor Karimy

(57) ABSTRACT

An array substrate and a display panel; the array substrate includes a substrate (6), a gate elelctrode (2), a gate insulation layer (1), a semiconductor active layer, a first etching barrier layer (4), and a source-drain layer (5); the gate elelctrode (2) is disposed at the substrate (6); and the gate insulation layer (1) covers the gate elelctrode (2).

10 Claims, 2 Drawing Sheets

ARRAY SUBSTRATE AND DISPLAY PANEL

CROSS-REFERENCE TO RELATED APPLICATIONS

This application is the International Application No. PCT/CN2018/113345 for entry into US national phase, with an international filing date of Nov. 1, 2018 designating the U.S., now pending, and claims priority benefits to Chinese Patent Application No. 201811131525.3, filed on Sep. 27, 2018, the contents of which being incorporated herein by reference.

BACKGROUND OF THE INVENTION

Field of the Invention

The present application relates to the field of a display panel, and more particularly to an array substrate and a display panel.

Description of Related Art

With the advancement of display technology, the panel display has become one of the indispensable necessaries for people. The active liquid crystal display includes an active array substrate, a color filter substrate and a liquid crystal layer located between the active array substrate and the color filter substrate. The organic light emitting diode display is mainly composed of an active array substrate and an organic light emitting diode. The above two display methods are required a stable and reliable array substrate.

Thin film transistor (TFT) is the main functional device of the array substrate, when the TFT is manufactured, the semiconductor active layer is partially exposed by boring on the etching barrier layer, and then the source and drain electrode are partially passed through the hole etched on the barrier layer to be overlapped with a central area of the semiconductor active layer, in this way, the overlapping area between the source electrode and the drain electrode and the gate electrode under the semiconductor active layer is larger, which may cause a large parasitic capacitance of the thin film transistor, and large-sized and high-resolution display is inconvenient to be manufactured.

BRIEF SUMMARY OF THE INVENTION

An object of the present application is to provide an array substrate, including but not limited to solve the problem that the parasitic capacitance of the array substrate is larger.

Technical Solutions

In order to solve above technical problem, the technical solution adopted by an embodiment of the present application is provided an array substrate, including:
 a substrate;
 a gate electrode, disposed at the substrate;
 a gate insulation layer, at least covering the gate electrode;
 a semiconductor active layer, disposed at a side of the gate insulation layer away from the gate electrode;
 a first etching barrier layer, disposed at a side of the semiconductor active layer away from the gate insulation layer, in which two ends of the semiconductor active layer are exposed relative to the first etching barrier layer; and
 a source-drain layer, comprising a source electrode and a drain electrode respectively overlying two ends of the first etching barrier layer and covering at least the two exposed ends of the semiconductor active layer relative to the first etching barrier layer.

Another object of the present application is to provide a display panel, including:
 a substrate;
 a gate electrode, disposed at the substrate;
 a gate insulation layer, at least covering the gate electrode;
 a semiconductor active layer, disposed at a side of the gate insulation layer away from the gate electrode;
 a first etching barrier layer, disposed at a side of the semiconductor active layer away from the gate insulation layer, in which two ends of the semiconductor active layer are exposed relative to the first etching barrier layer;
 a source-drain layer, comprising a source electrode and a drain electrode respectively overlying two ends of the first etching barrier layer and covering at least the two exposed ends of the semiconductor active layer relative to the first etching barrier layer;
 a color filter substrate; and
 a liquid crystal, filled between the color filter substrate and the source-drain layer.

Another object of the present application is to provide an array substrate, including:
 a substrate;
 a gate electrode, disposed at the substrate;
 a gate insulation layer, at least covering the gate electrode;
 a semiconductor active layer, disposed at a side of the gate insulation layer away from the gate electrode, in which the semiconductor active layer is an oxide semiconductor active layer;
 a first etching barrier layer, disposed at a side of the semiconductor active layer away from the gate insulation layer, wherein two ends of the semiconductor active layer are exposed relative to the first etching barrier layer;
 a second etching barrier layer, disposed at the gate insulation layer and spaced apart from the first etching barrier layer and the semiconductor active layer, misaligned with the gate electrode; and
 a source-drain layer, comprising a source electrode and a drain electrode respectively overlying two ends of the first etching barrier layer and covering at least the two exposed ends of the semiconductor active layer relative to the first etching barrier layer.

An embodiment of the present application is provided with an array substrate that the position corresponding to an edge of the semiconductor active layer and the etching barrier layer is removed, and the space between the source electrode and the drain electrode is increased, the overlapping area of the space with the gate electrode is reduced, the parasitic capacitance generated between the source-drain layer and the gate electrode is reduced, and the display quality of the corresponding display panel is improved.

BRIEF DESCRIPTION OF THE DRAWINGS

In order to explain the embodiments of the present application more clearly, a brief introduction regarding the accompanying drawings that need to be used for describing the embodiments of the present application or the prior art is given below; it is obvious that the accompanying drawings described as follows are only some embodiments of the present application, for those skilled in the art, other drawings can also be obtained according to the current drawings on the premise of paying no creative labor.

DESCRIPTION OF THE PREFERRED EMBODIMENTS

In order to make the purpose, the technical solution and the advantages of the present application be clearer and more understandable, the present application will be further described in detail below with reference to accompanying figures and embodiments. It should be understood that the specific embodiments described herein are merely intended to illustrate but not to limit the present application.

It is noted that when a component is referred to as being "fixed to" or "disposed at" another component, it can be directly or indirectly on another component. When a component is referred to as being "connected to" another component, it can be directly or indirectly connected to another component. Directions or location relationships indicated by terms such as "length", "width", "up", "down", "front", "rear", "left", "right", "vertical", "horizontal", "top", "bottom", "inside", "outside", and so on are the directions or location relationships shown in the accompanying figures, which are only intended to describe the present application conveniently and simplify the description, but not to indicate or imply that an indicated device or component must have specific locations or be constructed and manipulated according to specific locations; therefore, these terms shouldn't be considered as any limitation to the present application. Terms "the first" and "the second" are only used in describe purposes, and should not be considered as indicating or implying any relative importance, or impliedly indicating the number of indicated technical features. As such, technical feature(s) restricted by "the first" or "the second" can explicitly or impliedly comprise one or more such technical feature(s). In the description of the present application, "a plurality of" means two or more, unless there is additional explicit and specific limitation.

In order to explain the technical solutions described in the present application, the following detailed description will be made in conjunction with the specific drawings and embodiments.

Figure 1:
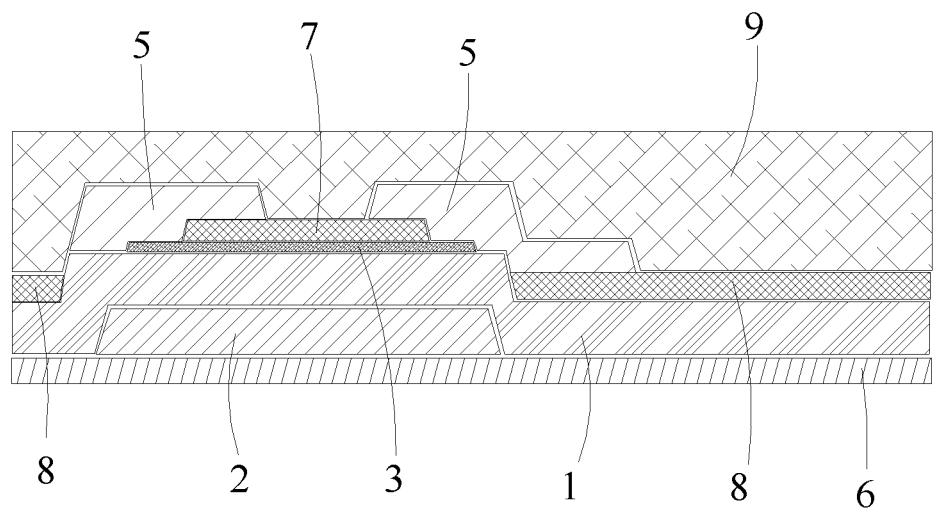
FIG. 1 is a structural schematic view of an array substrate in an embodiment of to the present application.
Figure 2:
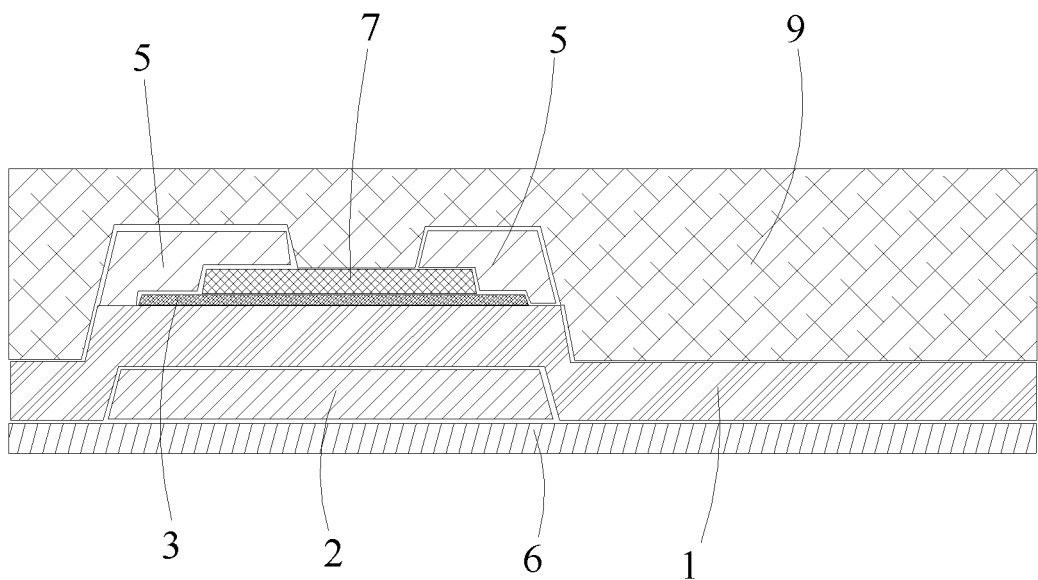
FIG. 2 is a structural schematic view of an array substrate in another embodiment of the present application.

As shown in FIG. 1 to FIG. 2, an embodiment of the present application is provided an array substrate, including: a substrate 6, a gate electrode 2, a gate insulation layer 1, a semiconductor active layer 3, a first etching barrier layer 7, and a source-drain layer 5; the gate electrode 2 is disposed at the substrate 6; the gate insulation layer 1 covers at least the gate electrode 2; the semiconductor active layer 3 is disposed at a side of the gate insulation layer 1 away from the gate electrode 2; the first etching barrier layer 7 is provided on a side of the semiconductor active layer 3 away from the gate insulation layer 1, both ends of the semiconductor active layer 3 are exposed relative to the first etching barrier layer 7; the source drain layer 5 includes a source electrode and a drain electrode, a source electrode and a drain electrode respectively covers both ends of the first etching barrier layer 7, the source-drain layer 5 covers least an exposed end of the semiconductor active layer relative to the first etching barrier layer 7.

Figure 3:
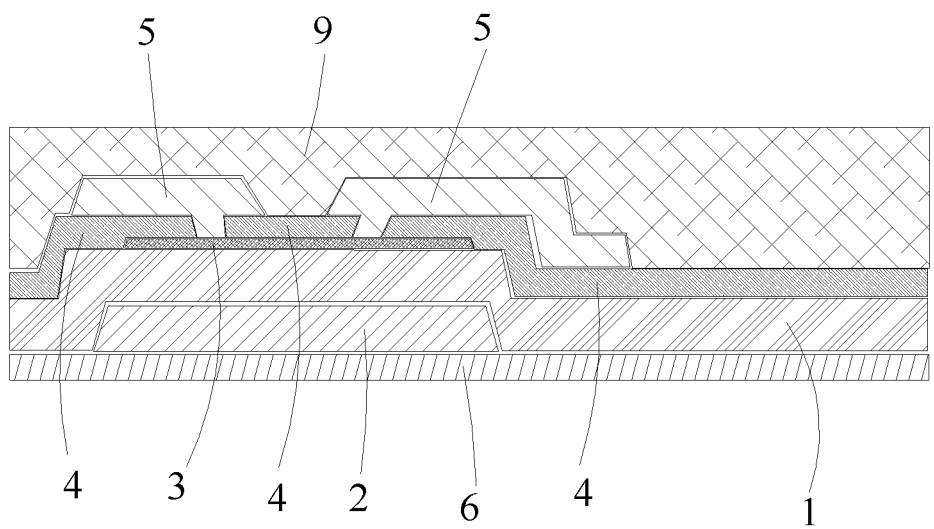
FIG. 3 is a structural schematic view of an array substrate in a comparative embodiment of the present application.

In the embodiment of the present application, both ends of the semiconductor active layer are exposed relative to the first etching barrier layer 7, and the source electrode and drain electrode of the source-drain layer 5 respectively cover both ends of the first etching barrier layer 7. After ensuring that the source electrode and the drain electrode are electrically connected, the source electrode and the drain electrode are moved away from the middle of the semiconductor active layer, thereby the overlapping area between the source electrode and the drain electrode and the gate electrode 2 is reduced, and the parasitic capacitance is reduced finally. As shown in FIG. 3, an array substrate provided by a comparative embodiment of the present application, a connection hole is formed in the etching barrier layer 4, and a source electrode and a drain electrode of the source-drain layer 5 overlapped with the semiconductor active layer is realized, thereby the electrical connection between the source electrode and the drain electrode is realized, but the arrangement of the source-drain layers 5 is such that the overlapping area between the source-drain layers 5 and the gate electrode 2 is larger, thereby the parasitic capacitance is larger, which is inconvenient to manufacture high-resolution displays. While compared with the array substrate provided in the comparative embodiment, the array substrate provided in the embodiment of the present application is effectively reduced the overlapping area between the source and drain electrode and the gate electrode 2, thereby a reduction in parasitic capacitance is realized and a production requirement of large-sized and high resolution of the display is satisfied.

In an embodiment, please refer to FIG. 2, the array substrate further includes a protection layer 9 covering the source-drain layer 5, and the protection layer 9 covers at least an exposed central portion of the first etching barrier layer 7 relative to the source-drain layer 5. The protection layer 9 completely covers the source-drain layers 5 to isolate the source-drain layers 5 from the external, and the electrical safety of the source-drain layers 5 is ensured; the protection layer 9 synchronously covers an exposed portion of the first etching barrier layer 7 relative to the source-drain layers 5, and specifically, the protection layer 9 synchronously covers a central portion of the first etching barrier layer 7 to protect the exposed portion of the first etching barrier layer.

In an embodiment, please refer to FIG. 2, the protection layer 9 also covers the exposed ends of the gate insulation layer 1 relative to the semiconductor active layer and the source-drain layer 5.

The semiconductor active layer and the source-drain layer 5 cover a partial area of the gate insulation layer 1, and the protection layer 9 covers a portion of the gate insulation layer 1 not covered by the semiconductor active layer and the source-drain layer 5 to realize the complete cover of the gate insulation layer 1, and to realize the side of the gate insulation layer 1 away from the gate electrode 2 is covered and protected by the protection layer 9, the semiconductor active layer, and the source-drain layer 5.

In an embodiment, the semiconductor active layer is one of an amorphous silicon semiconductor active layer, a polysilicon semiconductor active layer, and an oxide semiconductor active layer. The emiconductor active layer is optionally be an oxide semiconductor active layer in the embodiment.

In one embodiment, please refer to FIG. 1, the array substrate further includes: a second etching barrier layer 8, the second etching barrier layer 8 is disposed at the gate insulation layer 1, and the second etching barrier layer 8, the first etching barrier layer 7, and the semiconductor active layer are spaced apart from each other, and the second etching barrier layer 8 and the gate electrode 2 are misaligned with each other. The etching barrier layer includes the first etching barrier layer 7 disposed at a side of the semiconductor active layer away from the gate electrode 2, and the second etch barrier disposed at opposite sides of the first etching barrier layer 7, the second etching barrier layer 8 is misaligned with the gate electrode 2, that is, the second etching barrier layer 8 is disposed at a portion of the gate insulation layer 1 not covered by the gate electrode 2; there is only needed to manufacture the area between the first etching barrier layer 7 and the second etching barrier layer 8 during the process of manufacturing of the etching barrier layer; compared to the etching area is reduced relative to retaining only the first etch stop layer 7, the etching time and processing cost is significantly reduced for a larger area substrate.

In an embodiment, please refer to FIG. 1, the array substrate further includes a protection layer 9 covering on the source-drain layer 5, and the protection layer 9 covers at least an exposed portion of the second etching layer relative to the source-drain layer 5. The protection layer 9 completely covers the source-drain layer 5 to isolate the source-drain layers 5 from the external, and the electrical safety of the source-drain layers 5 is ensured; the protection layer 9 synchronously covers an exposed portion of the second etching layer relative to the source-drain layers 5 to protect the exposed portion of the second etch layer.

In an embodiment, please refer to FIG. 1, the protection layer 9 also covers an exposed portion of the first etching barrier layer 7 relative to the source-drain layer 5. The protection layer 9 synchronously covers the exposed portion of the first etching barrier layer 7 relative to the source-drain layer 5, and specifically, the protection layer 9 synchronously covers the central portion of the first etch stop layer 7 to protect the exposed portion of the first etch layer.

In an embodiment, please refer to FIGS. 1-2, a projection of the semiconductor active layer on the gate electrode 2 is within a boundary of the gate electrode 2. Both ends of the semiconductor active layer are exposed relative to the first etching barrier layer 7, and the projection of the semiconductor active layer on the gate electrode 2 is located within the boundary of the gate electrode 2, which ensures that after the source electrode and the drain electrode are moved away from the central direction of the semiconductor active layer, the overlapping area between the source-drain layer 5 and the gate electrode 2 is significantly reduced, thereby the parasitic capacitance is reduced.

An embodiment of the present application is further provided a display panel, including the above array substrate and other necessary components, such as, a liquid crystal display panel further includes a color filter substrate, a liquid crystal and a frame, the color filter substrate and the array substrate are arranged in pairs, peripheral portions of the color filter substrate and the array substrate are bonded by a seal, and the liquid crystal is filled between the color filter substrate and the array substrate. As described above, since the overlapping area between the source electrode and drain electrode and the gate electrode 2 in the array substrate is smaller, that is the generated parasitic capacitance is smaller, the display panel can meet the requirements for manufacturing a large-sized and high-resolution display, thereby the display panel provided by the embodiment has a higher resolution and can be set to a larger size.

In the embodiment of the present application, the display panel may also be an organic light emitting display panel, including the above array substrate and other necessary components, and the necessary components include components such as an organic material coating that emits light by self-illumination.

The aforementioned embodiments are only optional embodiments of the present application, and should not be regarded as being limitation to the present application. Any modification, equivalent replacement, improvement, and so on, which are made within the spirit and the principle of the present application, should be included in the protection scope of the present application.

What is claimed is:

1. An array substrate, comprising:
a substrate;
a gate electrode, disposed at the substrate;
a gate insulation layer, at least covering the gate electrode;
a semiconductor active layer, disposed at a side of the gate insulation layer away from the gate electrode;
a first etching barrier layer, disposed at a side of the semiconductor active layer away from the gate insulation layer, wherein two ends of the semiconductor active layer are exposed relative to the first etching barrier layer; and
a source-drain layer, comprising a source electrode and a drain electrode respectively overlying on two ends of the first etching barrier layer and covering at least the two exposed ends of the semiconductor active layer relative to the first etching barrier layer, wherein the array substrate further comprises:
a second etching barrier layer, disposed at the gate insulation layer and spaced apart from the first etching barrier layer and the semiconductor active layer, misaligned with the gate electrode.

2. The array substrate of claim 1, wherein the array substrate further comprises a protection layer, the protection layer covers the source-drain layer, and the protection layer covers at least an exposed portion of the first etching barrier layer relative to the source-drain layer.

3. The array substrate of claim 2, wherein the protection layer further covers exposed portions of the gate insulation layer respectively relative to the semiconductor active layer and the source-drain layer.

4. The array substrate of claim 3, wherein a projection of the semiconductor active layer on the gate electrode is located within a boundary of the gate electrode.

5. The array substrate of claim 1, wherein the semiconductor active layer is an amorphous silicon semiconductor active layer, a polycrystalline silicon semiconductor active layer, or an oxide semiconductor active layer.

6. The array substrate of claim 1, wherein the array substrate further comprises a protection layer, the protection layer covers the source-drain layer, and the protection layer covers at least an exposed portion of the second etching barrier layer relative to the source-drain layer.

7. The array substrate of claim 6, wherein the protection layer further covers an exposed portion of the first etching barrier layer relative to the source-drain layer.

8. The army substrate of claim 7, wherein a projection of the semiconductor active layer on the gate electrode is located within a boundary of the gate electrode.

9. The array substrate of claim 1, wherein a projection of the semiconductor active layer on the gate electrode is located within a boundary of the gate electrode.

10. An array substrate, comprising:
a substrate;
a gate electrode, disposed at the substrate;
a gate insulation layer, at least covering the gate electrode;
a semiconductor active layer, disposed at a side of the gate insulation layer away from the gate electrode, wherein the semiconductor active layer is an oxide semiconductor active layer;
a first etching barrier layer, disposed at a side of the semiconductor active layer away from the gate insulation layer, wherein two ends of the semiconductor active layer are exposed relative to the first etching barrier layer;

a second etching barrier layer, disposed at the gate insulation layer and spaced apart from the first etching barrier layer and the semiconductor active layer, misaligned with the gate electrode; and a source-drain layer, comprising a source electrode and a drain electrode respectively overlying two ends of the first etching barrier layer and covering at least the two exposed ends of the semiconductor active layer relative to the first etching barrier layer.

* * * * *